(12) United States Patent
Schulz-Harder

(10) Patent No.: US 8,435,640 B2
(45) Date of Patent: May 7, 2013

(54) METAL-CERAMIC SUBSTRATE

(75) Inventor: Jürgen Schulz-Harder, Lauf (DE)

(73) Assignee: Curamik Electronics GmbH, Eschenbach (DE)

( * ) Notice: Subject to any disclaimer, the term of this patent is extended or adjusted under 35 U.S.C. 154(b) by 958 days.

(21) Appl. No.: 11/990,179

(22) PCT Filed: Jun. 2, 2006

(86) PCT No.: PCT/DE2006/000951
§ 371 (c)(1),
(2), (4) Date: Feb. 8, 2008

(87) PCT Pub. No.: WO2007/016886
PCT Pub. Date: Feb. 15, 2007

(65) Prior Publication Data
US 2010/0260988 A1    Oct. 14, 2010

(30) Foreign Application Priority Data

Aug. 10, 2005 (DE) .......................... 10 2005 038 046
Sep. 8, 2005 (DE) .......................... 10 2005 042 554

(51) Int. Cl.
C04B 37/02 (2006.01)
C04B 35/622 (2006.01)
C04B 37/00 (2006.01)
B32B 18/00 (2006.01)
B32B 7/02 (2006.01)
B32B 15/04 (2006.01)

(52) U.S. Cl.
USPC ........... 428/448; 428/213; 428/336; 428/332; 428/337; 428/446; 428/450; 428/220; 156/89.27

(58) Field of Classification Search .................. None
See application file for complete search history.

(56) References Cited

U.S. PATENT DOCUMENTS

| | | | |
|---|---|---|---|
| 3,744,120 A | | 7/1973 | Burgess et al. |
| 4,443,059 A | * | 4/1984 | Wells ............................ 359/845 |
| 5,874,175 A | * | 2/1999 | Li ................................ 428/457 |
| 5,981,036 A | * | 11/1999 | Schulz-Harder et al. .. 428/195.1 |
| 6,086,990 A | | 7/2000 | Sumino et al. |
| 6,110,596 A | * | 8/2000 | Kasori et al. ................... 428/428 |
| 6,258,449 B1 | * | 7/2001 | Nagasawa et al. ............ 428/209 |
| 2003/0030141 A1 | * | 2/2003 | Araki et al. .................... 257/720 |
| 2003/0157360 A1 | * | 8/2003 | Shinkai et al. ................. 428/621 |
| 2004/0100164 A1 | * | 5/2004 | Murata et al. .................. 310/348 |
| 2006/0163605 A1 | * | 7/2006 | Miyahara ....................... 257/103 |
| 2009/0020321 A1 | * | 1/2009 | Schulz-Harder .............. 174/256 |

FOREIGN PATENT DOCUMENTS

| | | |
|---|---|---|
| DE | 2213115 | 9/1973 |
| DE | 2319854 | 10/1973 |
| EP | 0153618 | 9/1985 |
| EP | 0499589 | 8/1992 |
| EP | 0 798 781 | 10/1997 |

* cited by examiner

*Primary Examiner* — Vera Katz
(74) *Attorney, Agent, or Firm* — Welsh Flaxman & Gitler LLC

(57) ABSTRACT

In the case of a metal-ceramic substrate with a multilayered ceramic material in sheet form, and with at least one metallization that is provided on one surface side of the ceramic material and is joined to be ceramic material by direct bonding or active soldering, the ceramic material has at least one inner layer or base layer of a silicon nitride ceramic. The surface side of the ceramic material that is provided with the at least one metallization is formed by an intermediate layer of an oxidic ceramic applied to the base layer.

23 Claims, 2 Drawing Sheets

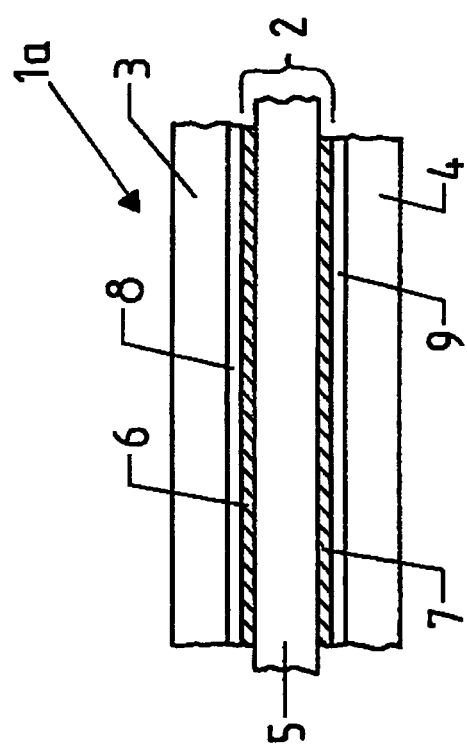

METAL-CERAMIC SUBSTRATE

BACKGROUND OF THE INVENTION

The invention relates to a metal-ceramic substrate with a multi-layer, plate-shaped ceramic material and comprising at least one metallization, metal lining, provided on or applied to the surface of the ceramic material, which metallization is bonded to the ceramic material by means of direct bonding (DCB) or active soldering. The ceramic material consists of at least one inner layer or base layer of a silicon nitride ceramic, and the surface of the ceramic material provided with the at least one metallization being formed from an intermediate layer of an oxidic ceramic applied to the at least one base layer.

The invention further relates to a method for manufacturing a metal-ceramic substrate comprising a multi-layer, plate-shaped ceramic material, which consists of at least one inner layer or base layer of a silicon nitride ceramic and comprising at least one metallization provided on a surface of the ceramic material, in which an intermediate layer of an oxidic ceramic is formed on the surface of the ceramic material on the at least one base layer to be provided with the at least one metallization and the at least one metallization is applied to said intermediate layer by direct bonding (DCB) or active soldering of at least one metal layer or foil.

Metal-ceramic substrates or ceramic substrates with metallizations are known in the art, particularly also as circuit boards or substrates for electrical and electronic circuits or modules, especially for high-power circuits or modules.

Also known is the so-called DCB process for the direct bonding with a ceramic material or substrate for manufacturing the metallization required for circuit boards, connections, etc. on a ceramic substrate, e.g. on an aluminum oxide ceramic substrate. In this method, described for example in US-PS 37 44 120 or DE-PS 23 19 854, the surfaces of metal layers or foils, e.g. copper layers or foils are provided with a coating of a chemical compound consisting of the metal, e.g. copper and a reactive gas, preferably oxygen. This coating forms an eutectic or melting layer together with a thin layer of the adjoining metal, with a melting temperature below the melting temperature of the metal, e.g. copper, so that by applying the metal layer or foil to the ceramic and heating all layers, they are bonded together, namely by melting of the metal essentially only in the area of the melting layer or oxide layer. When copper or a copper alloy is used as the metal, this method is also referred to as DCB bonding or the DCB process (direct copper bonding). This DCB process then comprises, for example, the following process steps:

Oxidation of a copper foil so as to produce an even copper oxide layer;
placing the copper foil on the ceramic layer;
heating the composite to a process temperature between approx. 1025 and 1083° C., e.g. to approx. 1071° C.;
cooling to room temperature.

Also known is the so-called active soldering method (DE 22 13 115; EP-A-153 618) for bonding metal layers or metal foils forming metallizations, in particular also of copper layers or copper foils, with the respective ceramic material. In this process, which is used especially for manufacturing a metal-ceramic substrate, a bond is produced at a temperature of ca. 800-1000° C. between a metal foil, for example copper foil, and a ceramic substrate, for example aluminum nitride ceramic, using a hard solder, which in addition to a main component such as copper, silver and/or gold also contains an active metal. This active metal, which is at least one element of the group Hf, Ti, Zr, Nb, Ce, creates a bond between the solder and the ceramic through chemical reaction, while the bond between the solder and the metal is a metallic hard solder bond.

Also known is a metal-ceramic substrate with an inner layer or base layer of a silicon nitride ceramic (EP 798 781) that has a significantly higher mechanical strength as compared with other ceramics, in particular as compared with an aluminum oxide ceramic ($Al_2O_3$). To enable application of the metallizations with the DCB process, it has been suggested to apply an intermediate layer of a pure aluminum oxide ceramic to the base layer of the silicon nitride ceramic. However, this method does not result in a complete bond, and in particular not in a bond without defects or defective spots, between the ceramic material and the metallization. Rather, especially with the use of metallizations of copper, this method results in numerous gas cavities between the metallization and the ceramic material, due to a reaction between the oxygen and the copper or copper oxide eutectic (CU/$Cu_2O$ eutectic) and the silicon nitride ceramic, namely corresponding to the following formula:

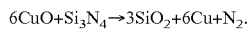

$$6CuO+Si_3N_4 \rightarrow 3SiO_2+6Cu+N_2.$$

This reaction not only uses up the liquid eutectic $Cu/Cu_2$ phase required for the bonding, but also results in the formation of bubbles due to the gaseous nitrogen ($N_2$). This disadvantageous reaction cannot be avoided by the intermediate layer of pure aluminum oxide ceramic. Based on a finding of the present invention, this is due to the very different thermal expansion coefficients of silicon nitride ($3.0 \times 10^{-6}$ $K^{-1}$) and aluminum oxide ($8 \times 10^{-6}$ $K^{-1}$). These differences in the thermal expansion coefficient causes cracks in the intermediate layer during melting on or sintering of the intermediate layer of the aluminum oxide ceramic, but also during bonding of the metallizations during the DCB process, so that these cracks allow the above-described reaction between the $Cu/Cu_2O$ eutectic and the silicon nitride ceramic.

Also known (EP 0 499 589) is a method for providing at least one intermediate layer of pure silicon oxide ($SiO_2$) on a ceramic base layer and then applying the metallization by means of the DCB process. This procedure likewise does not produce usable results, since the eutectic melting required for the DCB process reacts with the $SiO_2$ to form liquid $Cu_2O$—$SiO_2$. An intermediate layer of $SiO_2$ therefore cannot be used for applying the metallizations using the DCB process.

It is an object of the invention is to present a metal-ceramic substrate that retains the basic advantages of the silicon nitride ceramic while preventing the aforementioned disadvantages.

SUMMARY OF THE INVENTION

This object is achieved by a metal-ceramic substrate comprising a multi-layer, plate-shaped ceramic material and comprising at least one metallization provided on the surface of the ceramic material, which (metallization) is bonded to the ceramic material by means of direct bonding (DCB) or active soldering, the ceramic material consisting of at least one inner layer or base layer of a silicon nitride ceramic, and the surface of the ceramic material provided with the at least one metallization being formed from an intermediate layer of an oxidic ceramic applied to the at least one base layer, wherein the at least one intermediate layer of the oxidic ceramic has a thermal expansion coefficient smaller than or not greater than $6 \times 10^{-6}$ $K^{-1}$, and wherein the free silicon oxide ($SiO_2$) content in the oxidic ceramic forming the at least one intermediate layer is negligible at least in the area of the bond between the intermediate layer and the metallization.

Especially suitable materials for the intermediate layer are forsterite, cordierite, mullite or a combination of at least two of these ceramic materials, possibly also aluminum oxide in combination with forsterite and/or cordierite and/or mullite.

Preferably the oxidic ceramic forming the intermediate layer contains additional sintering additives (e.g. rare earth elements), in addition to further oxidic components, such as $LiO_2$, $TiO_2$, BaO, ZnO, $B_2O_3$, CsO, $Fe_2O_3$, $ZrO_2$, CuO, $Cu_2O$. Combinations of at least of these components can also be used as oxidic additives, in which case the content of these three oxidic additives makes up a maximum of 20 percent by weight of the total mass of the intermediate layer. This oxidic additive makes it possible to precisely control or adjust the properties of the intermediate layer with respect to the fusing temperature. Moreover, the additives make it possible to suppress reactions of the copper oxide (in particular $Cu_2O$) in the DCB process, which can result in fusible reaction products. These rare earth elements in the intermediate layer can also be present due to diffusion of the silicon nitride ceramic base layer during melting of the intermediate layer.

The substrate according to the invention features high adhesive or peel strength of the metallization on the ceramic material. A further significant advantage of the substrate according to the invention is that the ceramic forming the intermediate layer has an elasticity module greater than 300 GPa, so that the oxidic ceramic forming the intermediate layer achieves optimum compensation of the very different thermal expansion coefficients of the silicon nitride ceramic and the metal (e.g. copper) of the metallizations, namely as opposed to the relatively high elasticity module of 390 GPa of aluminum oxide.

In particular, the low elasticity module of the intermediate layer enables metallizations with a high thickness, namely up to three times the thickness of the base layer of the silicon nitride ceramic.

BRIEF DESCRIPTION OF THE DRAWINGS

The invention is explained below in more detail based on exemplary embodiments with reference to the drawings, wherein:

FIG. 4 is a representation similar to FIG. 1 of a further possible embodiment of the substrate according to the invention.

BRIEF DESCRIPTION OF THE INVENTION

Figure 1:
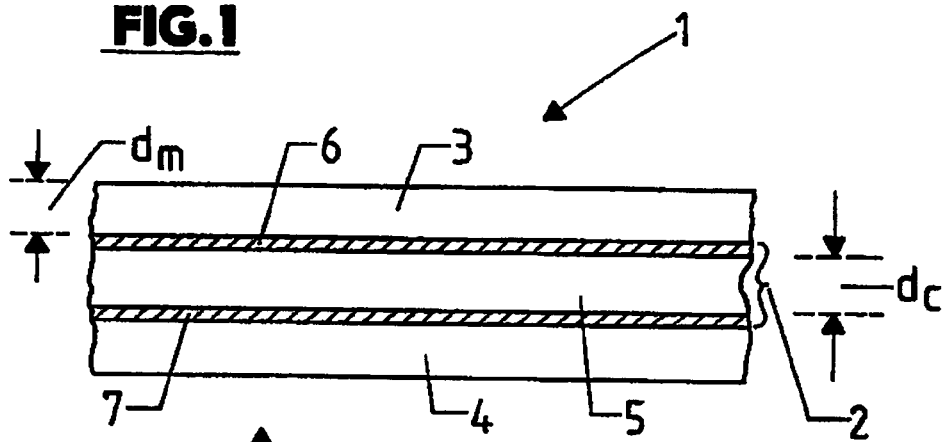
FIG. 1 is a simplified representation of a cross section of a substrate according to the invention.

The metal-ceramic substrate generally designated 1 in FIG. 1 consists of a plate-shaped ceramic material 2, which is provided on each surface with a metallization 3 and 4 made of a metal foil, i.e. in the depicted embodiment of a copper foil, with a thickness $d_m$ applied by means of the DCB process. The ceramic material 2 has a multi-layer design, namely consisting of an inner ceramic or base layer 5 of silicon nitride ($Si_3N_4$), which is provided on each side with an intermediate layer 6 and 7 of an oxidic ceramic, so that the application of the metallizations 3 and 4 is possible without defective spots and with high adhesion of the copper forming the metallizations 3 and 4 on the ceramic material 2.

The base layer 5 has a thickness $d_c$ and also contains, for example, sintering means in the form of an oxide of Ho, Er, Yb, Y, La, Sc, Pr, Ce, Nd, Dy, Sm and/or Gd. Combinations of one or more of these oxides are also possible as sintering means, in which case $Ho_2O_3$ or $Er_2O_3$ are primarily used. The content of sintering means in the middle layer is for example between 1 and 8 percent by weight of the total mass of the ceramic forming the base layer 5.

In the depicted embodiment, the two metallizations 3 and 4 have the same thickness $d_m$, which can be a maximum of three times the thickness $d_c$. Normally, the thickness of the metallizations 3 and 4 is between 0.01 and 1 mm. The thickness $d_c$ is for example between 0.1 and 2 mm.

The intermediate layers 6 and 7, which are much thinner than the base layer 5 and the metallizations 3 and 4, have a thickness between 0.1 and 10 μm, for example and consist of an oxidic ceramic, which contains no free silicon oxide ($SiO_2$) or in which the content of free $SiO_2$ is negligible at least in the areas of the intermediate layer 6 and 7 adjoining said metallizations.

A suitable material for the intermediate layers 6 and 7 is an oxidic ceramic with a thermal expansion coefficient smaller than or not greater than $6\times10^{-6}$ $K^{-1}$. The following ceramics are particularly suitable for the intermediate layers 6 and 7.

| | |
|---|---|
| Forsterite ($2MgO$—$SiO_2$) | $1.5 \times 10^{-6}$ $K^{-1}$ |
| Cordierite ($2MgO$—$2Al_2O_3$—$5SiO_2$) | $1.4$-$2.6 \times 10^{-6}$ $K^{-1}$ |
| Mullite ($3Al_2O_3$—$2SiO_2$) | $4.5$-$5.3 \times 10^{-6}$ $K^{-1}$ |

The thermal expansion coefficient of aluminum oxide ($Al_2O_3$) on the other hand is $8\times10^{-6}$ $K^{-1}$.

Combinations of one or more of the above oxide ceramics are also suitable for the intermediate layers 6 and 7, in which case the E-module for the intermediate layers is preferably smaller than, but not greater than 300 GPa, in order to achieve a certain compensation of the very different thermal expansion coefficients between the metal or copper of the metallizations 3 and 4 and the $Si_3N_4$ of the inner layer 5.

The above materials for the intermediate layers 6 and 7 also enable optimum compliance with said requirement for the expansion behavior or elasticity of the intermediate layers, namely with the use of forsterite, cordierite and mullite and/or a high content of these materials in the respective intermediate layer 6 and 7.

The elasticity modules are as follows:

| Ceramic material | Elasticity module: |
|---|---|
| Forsterite | 250 GPa |
| Cordierite | 140 GPa |
| Mullite | 220 GPa |
| Aluminum oxide | 390 GPa |

Preferably the intermediate layers 6 and 7 contain, as described above, one or more additives from the group, $LiO_2$, $TiO_2$, BaO, ZnO, $B_2O_3$, CsO, $Fe_2O_3$, $ZrO_2$, CuO and/or $Cu_2O$, up to a maximum content of 20 percent by weight of the total mass of the respective intermediate layer.

In the manufacture of the substrate 1, a plate made of the silicon nitride ceramic ($Si_3N_4$ ceramic) forming the base layer 5 is used as the starting material. Said plate is then coated on both sides using a suitable process to form the respective intermediate layer 6 and 7 with the suitable ceramic component(s) for the intermediate layer.

Various methods are available for applying this coating, in which for example the ceramic material forming the respective intermediate layer is deposited in combination with a suitable liquid, for example water, on the surfaces of the plate-shaped starting material. Afterwards, after drying, the intermediate layer 6 and 7 is melted on or dense sintered at a temperature between 1200 and 1680° C. in an oxidized atmosphere.

The coating is applied to the starting material for example using microdispersive to nanodispersive mixtures containing the ceramic material, e.g. by spraying, immersion (dip coating or spin coating) of aqueous dispersions; other methods, such as the sol-gel-process can also be used.

After application of the intermediate layers 6 and 7, the metal or copper foils forming the metallizations 3 and 4 are bonded using the known DCB process.

The substrate 1 can be manufactured as a large surface substrate, for example with dimensions greater than 80×80 mm, preferable greater than 100×150 mm, so that the substrate 1, through further processing, i.e. through corresponding structuring of the metallizations 3 and 4, can be used to manufacture a multiple printed panel or multiple substrate, which can then be divided into numerous single substrates.

The substrate 1 with the structure described above features improved mechanical strength, namely due to the base layer 5 of silicon nitride ceramic. Further, the metallizations 3 and 4 can be bonded using the time-tested DCB process with the normal process means, namely without the risk of defective spots in the bond between the metallizations 3 and 4 and the ceramic material 2, which (defective spots) extremely impair the adhesion of the metallizations on the ceramic material and also can impair the dielectric strength of the substrate.

Figure 2:
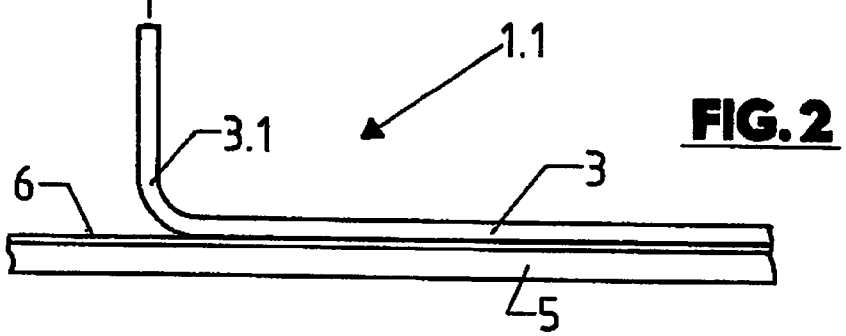
FIG. 2 is a schematic representation of a method for determining the adhesive or peel strength of a metallization formed by a foil applied to the ceramic material

Use of the substrate 1 with the structure described above achieves sufficiently high adhesion of the metallizations on the ceramic material 2. This adhesion or peel strength is measured using the method depicted in FIG. 2. A test sample 1.1, the structure of which corresponds to the substrate 1, however only with the metallization 3 and the intermediate layer 6, is manufactured in the manner described above; the metallization 3 is manufactured as a strip with a width of 1 cm and a thickness $d_m$ of 0.3 mm. With the test piece clamped, a force F is applied to the upward extending end 3.1 of the strip-shaped metallization 3, with such intensity that the strip-shaped metallization 3 is pulled off of the ceramic material 1 at a speed of 0.5 cm/min. The force F required for this then defines the adhesion or peel strength, which is greater than 40 N/cm for the substrate 1 as embodied above.

Figure 3:
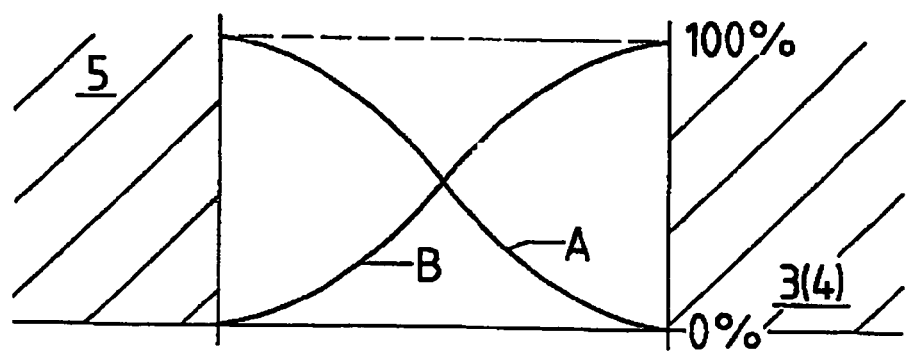
FIG. 3 is a diagram showing the distribution of free silicon oxide ($SiO_2$) in the intermediate layer of an oxidic ceramic.

FIG. 3 shows a diagram with the distribution (Curve A) of the free silicon oxide ($SiO_2$) in the intermediate layer 6 or 7, starting from the inner layer 5 to the metallization 3 or 4. As indicated by Curve A, the content of free $SiO_2$ in relation to the content of the oxide ceramic forming the intermediate layer decreases drastically toward the respective metallization 3 or 4, and the content of free $SiO_2$ in the area of the metallization is reduced to 0 percent by weight, in relation to the total mass of the intermediate layer. Curve B in FIG. 3 shows the curve of the content of the oxide ceramic forming the intermediate layer, including the aforementioned additives; the oxide ceramic is mullite, forsterite, cordierite or a combination of one or more of these ceramics.

FIG. 4 shows in a representation similar to FIG. 1, as a further possible embodiment, a substrate 1a, which differs from substrate 1 in that the metallizations 3 and 4 are applied to the ceramic material 2 not by means of the DCB process, but rather by the active soldering process. To achieve this, a layer 8 and 9 of active solder is applied to the surface of the ceramic material, which likewise consists of the base layer 5 of the $Si_3N_4$ ceramic and of the two intermediate layers 6 and 7, therefore bonding the respective metallization or the metal or copper foil forming said metallization with the ceramic material 2.

Suitable materials for the active solder are materials that are normally used, e.g. active solder containing a base component or solder component, such as copper/silver, and an active component, such as Ti, Hf or Zr. The manufacture of the substrate 1a is likewise such that the ceramic material 2 is first manufactured in one or more preceding process steps. Afterwards, the metallizations 3 and 4 are applied using the known active soldering process, in which the layers 8 and 9 of active solder are applied either as a paste or a foil.

To manufacture the strip conductors, contacts surfaces, etc., the metal-ceramic substrates are structured in the usual manner, using the usual technology, e.g. the known etch-masking technology.

The invention was described above based on exemplary embodiments. It goes without saying that numerous modifications and variations are possible without abandoning the underlying inventive idea upon which the invention is based.

| Reference list | |
|---|---|
| 1, 1a | metal-ceramic substrate |
| 1.1 | test sample |
| 2 | ceramic material |
| 3, 4 | metallization |
| 5 | inner layer of silicon nitride ceramic |
| 5, 6 | intermediate layer of an oxidic ceramic |
| 8, 9 | active soldering layer |
| F | pull-off strength |
| $d_c$ | thickness of inner layer of silicon nitride ceramic |
| $d_m$ | thickness of the metal layers forming the metallization |

The invention claimed is:

1. A metal-ceramic substrate comprising a multi-layer, plate-shaped ceramic material base layer and at least one copper or copper alloy metallization applied on a surface side of the ceramic material base layer with an oxidic ceramic intermediate layer between the ceramic material base layer and the at least one copper or copper alloy metallization, said at least one copper or copper alloy metallization being bonded to the ceramic material base layer by means of direct bonding (DCB) or an active soldering process, wherein the ceramic material base layer is coated on at least one surface with an oxidic ceramic material forming the oxidic ceramic intermediate layer and the oxidic ceramic material is melted on or dense sintered at a temperature between 1200° C. and 1680° C., the ceramic material base layer comprising at least one base layer of a silicon nitride ceramic,
  wherein the oxidic ceramic intermediate layer has a thermal expansion coefficient not greater than $6\times10^{-6}$ $K^{-1}$,
  wherein a free silicon oxide content in the oxidic ceramic intermediate layer is approximately zero at least in an area of a bond between the oxidic ceramic intermediate layer and the at least one copper or copper alloy metallization, and
  wherein the free silicon oxide content in the oxidic ceramic intermediate layer increases in relation to an oxidic ceramic content from the area of the bond between the oxidic ceramic intermediate layer and the at least one copper or copper alloy metallization toward a surface side of the ceramic material base layer.

2. The substrate according to claim 1, wherein outer dimensions of the substrate are greater than 100 mm×150 mm.

3. The substrate according to claim 1, wherein said oxidic ceramic intermediate layer is two layers, one on each surface of the ceramic material.

4. The substrate according to claim 3, wherein the at least one copper or copper alloy metallization is applied to each of the two layers of the oxidic ceramic intermediate layer.

5. The substrate according to claim 1, wherein the ceramic material base layer is symmetrical to a center plane extending parallel to surfaces of the ceramic material base layer.

6. The substrate according to claim 1, wherein a thickness of a composite layer comprises a thickness of said oxidic ceramic intermediate layer and a thickness of the at least one copper or copper alloy metallizations, and the composite layer is symmetrical to a center plane extending parallel to the surfaces of the substrate.

7. The substrate according to claim 1, wherein a ceramic material used for the oxidic ceramic intermediate layer has an elasticity module smaller than 300 GPa.

8. The substrate according to claim 1, wherein a thickness of the oxidic ceramic intermediate layer is smaller than a thickness of the ceramic material base layer of a silicon nitride ceramic supporting said oxidic ceramic intermediate layer and smaller than a thickness of the at least one copper or copper alloy metallization.

9. The substrate according to claim 8, wherein the thickness of the at least one copper or copper alloy metallization is not greater than three times the thickness of the ceramic material base layer of the silicon nitride ceramic.

10. The substrate according to claim 1, wherein a thickness of the oxidic ceramic intermediate layer is between 0.1 and 10 μm.

11. The substrate according to claim 1, wherein a thickness of the ceramic material base layer of silicon nitride ceramic is between 0.1 and 2 mm.

12. The substrate according to claim 1, wherein a thickness of the at least one copper or copper alloy metallization is between 0.5 and 1 mm.

13. The substrate according to claim 1, wherein the intermediate layer is forsterite, cordierite, mullite or a mixture of at least two of these components.

14. The substrate according to claim 1, wherein a ceramic of the intermediate layer contains an aluminum oxide ceramic.

15. The substrate according to claim 1, wherein the ceramic of the at least one intermediate layer contains sintering means, in a form of at least one rare earth element.

16. The substrate according to claim 15, wherein the ceramic of the at least one intermediate layer comprises a sintering means an oxide of Ho, Er, Yb, Y, La, Sc, Pr, Ce, Nd, Dy, Sm, Gd or combinations of at least two of the oxides.

17. The substrate according to claim 15, wherein a content of the sintering means is between 1.0 and 8.0 percent by weight.

18. The substrate according to claim 1, wherein a ceramic of the intermediate layer comprises an additive of at least one oxidic component selected from the group consisting of $Li_2O$, $TiO_2$, BaO, ZnO, $B_2O_3$, CsO, $Fe_2O_3$, $ZrO_2$, CuO, and $Cu_2O$, and a content of said additive makes up a maximum of 20 percent by weight of a total mass of the intermediate layer.

19. The substrate according to claim 1, wherein the ceramic material base of silicon nitride ceramic has a thermal conductivity greater than 45 W/mK.

20. The substrate according to claim 1, wherein an adhesive and peel strength of the at least one copper or copper alloy metallization on the oxidic ceramic intermediate layer is greater than 40 N/cm.

21. The substrate according to claim 1, wherein at least one layer of an active solder is applied between the oxidic ceramic intermediate layer and an adjoining metallization.

22. The substrate according to claim 21, wherein the active solder consists of a base component suitable as a solder and an active metal, selected from Ti, Hf, Zr, Nb or Ce.

23. The substrate according to claim 1, wherein outer dimensions of the substrate are greater than 80 mm×80 mm.

* * * * *